(12) United States Patent
Lee et al.

(10) Patent No.: US 9,287,374 B2
(45) Date of Patent: Mar. 15, 2016

(54) SEMICONDUCTOR DEVICE AND METHOD FOR FORMING THE SAME

(71) Applicant: SK HYNIX INC., Icheon (KR)

(72) Inventors: Yu Jun Lee, Yangsan (KR); Kyoung Chul Jang, Seongnam (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/315,170

(22) Filed: Jun. 25, 2014

(65) Prior Publication Data

US 2015/0279950 A1     Oct. 1, 2015

(30) Foreign Application Priority Data

Mar. 26, 2014    (KR) ........................ 10-2014-0035447

(51) Int. Cl.

| | |
|---|---|
| *H01L 21/762* | (2006.01) |
| *H01L 21/265* | (2006.01) |
| *H01L 29/423* | (2006.01) |
| *H01L 29/78* | (2006.01) |
| *H01L 27/105* | (2006.01) |
| *H01L 29/06* | (2006.01) |
| *H01L 21/311* | (2006.01) |
| *H01L 21/768* | (2006.01) |
| *H01L 27/108* | (2006.01) |
| *H01L 21/02* | (2006.01) |
| *H01L 21/8242* | (2006.01) |

(52) U.S. Cl.
CPC ...... *H01L 29/4236* (2013.01); *H01L 21/02329* (2013.01); *H01L 21/26586* (2013.01); *H01L 21/31111* (2013.01); *H01L 21/76224* (2013.01); *H01L 21/76897* (2013.01); *H01L 27/1052* (2013.01); *H01L 27/10823* (2013.01); *H01L 29/0642* (2013.01); *H01L 29/78* (2013.01)

(58) Field of Classification Search
CPC ............... H01L 21/76224; H01L 21/02329; H01L 21/26586; H01L 29/4236; H01L 27/10823

See application file for complete search history.

(56) References Cited

U.S. PATENT DOCUMENTS

| | | | | |
|---|---|---|---|---|
| 6,140,208 | A * | 10/2000 | Agahi et al. .................. | 438/437 |
| 6,245,639 | B1 * | 6/2001 | Tsai et al. ..................... | 438/424 |
| 6,323,106 | B1 * | 11/2001 | Huang et al. .................. | 438/433 |
| 6,337,256 | B1 * | 1/2002 | Shim ............................ | 438/435 |
| 6,541,350 | B2 * | 4/2003 | Chen ............................ | 438/424 |
| 6,734,081 | B1 * | 5/2004 | Puchner et al. ............... | 438/432 |
| 7,727,856 | B2 * | 6/2010 | Teo ................... | H01L 21/31155 257/E29.286 |
| 7,737,009 | B2 * | 6/2010 | Lindsay ............ | H01L 21/26506 257/288 |
| 7,812,250 | B2 * | 10/2010 | Smith ........................... | 136/255 |
| 2002/0100953 | A1 * | 8/2002 | Park ............................. | 257/510 |
| 2004/0248373 | A1 * | 12/2004 | Park ............................. | 438/424 |
| 2006/0043521 | A1 * | 3/2006 | Trivedi et al. ................. | 257/499 |

(Continued)

FOREIGN PATENT DOCUMENTS

| | | | |
|---|---|---|---|
| KR | 20050003060 A | * | 1/2005 |
| KR | 10-2006-0100714 A | | 9/2006 |

(Continued)

*Primary Examiner* — Bac Au
*Assistant Examiner* — Toniae Thomas

(57) ABSTRACT

A semiconductor device and a method for forming the same are disclosed. The semiconductor device includes an active region, a device isolation film, a first liner nitride film disposed over a lower portion of a sidewall of the active region, and a second liner nitride film disposed over an upper portion of the sidewall of the active region and having a higher density of nitrogen than a density of nitrogen in the first liner nitride film.

17 Claims, 10 Drawing Sheets

(56) References Cited

U.S. PATENT DOCUMENTS

| | | | |
|---|---|---|---|
| 2007/0232021 A1* | 10/2007 | Eun | H01L 21/76224 438/424 |
| 2007/0267676 A1* | 11/2007 | Kim et al. | 257/311 |
| 2007/0293045 A1* | 12/2007 | Youn | H01L 21/76224 438/689 |
| 2008/0286936 A1* | 11/2008 | Zhao | H01L 21/76235 438/433 |
| 2011/0175171 A1* | 7/2011 | Nam | H01L 21/26506 257/369 |
| 2011/0248331 A1* | 10/2011 | Sun | H01L 21/76224 257/324 |
| 2012/0012912 A1* | 1/2012 | Kwon | 257/302 |
| 2014/0008652 A1* | 1/2014 | Hsu et al. | 257/52 |
| 2014/0077294 A1* | 3/2014 | Hwang et al. | 257/330 |
| 2015/0001669 A1* | 1/2015 | Chou | H01L 21/76224 257/506 |

FOREIGN PATENT DOCUMENTS

| | | |
|---|---|---|
| KR | 10-2008-0010661 A | 1/2008 |
| KR | 10-2010-0079149 A | 7/2010 |

\* cited by examiner

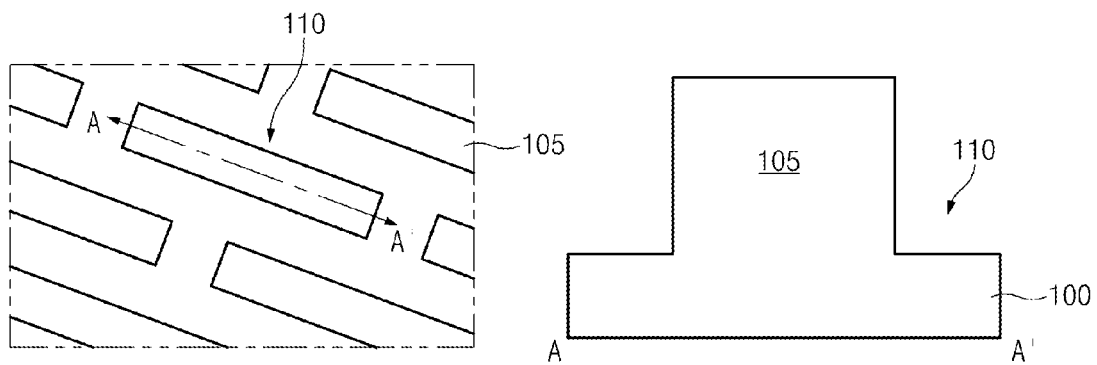
Fig.4a (i)  Fig.4a (ii)
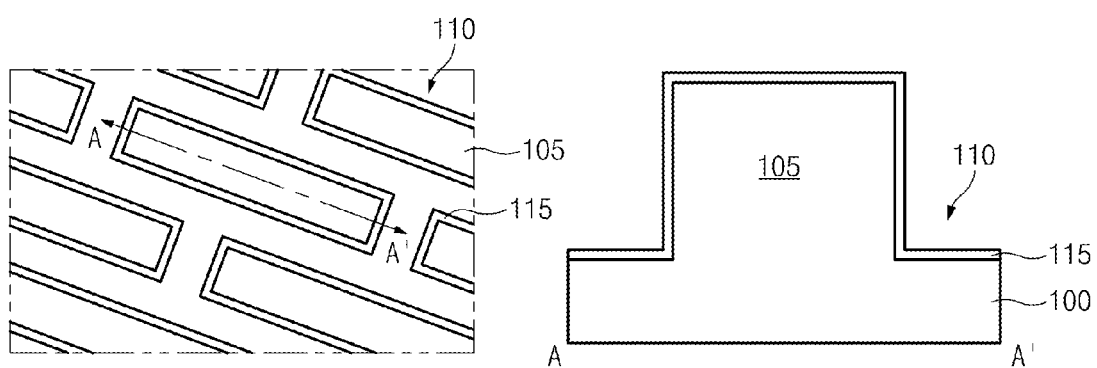
Fig.4b (i)  Fig.4b (ii)

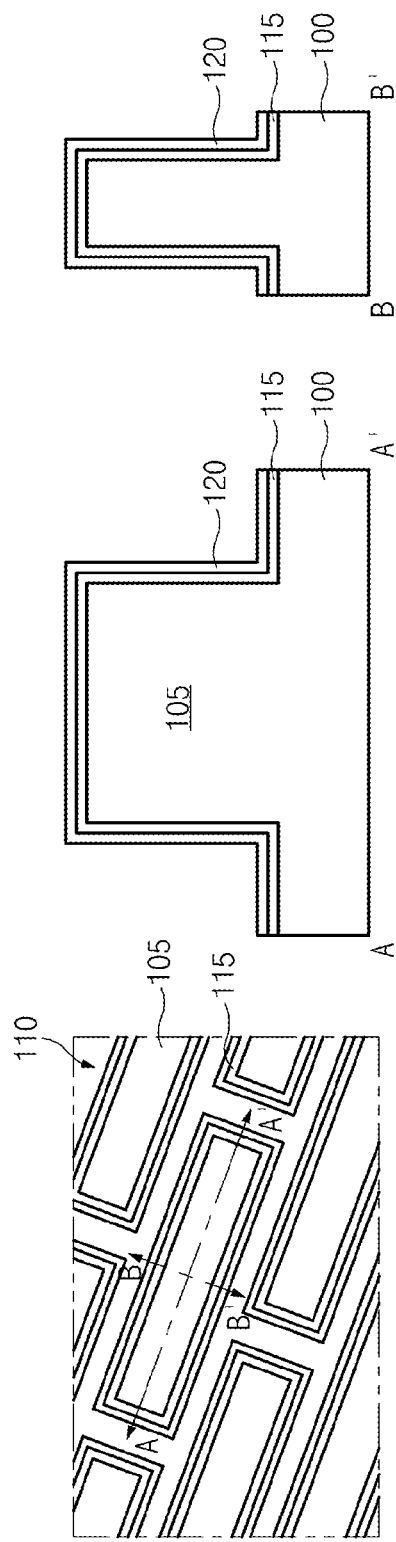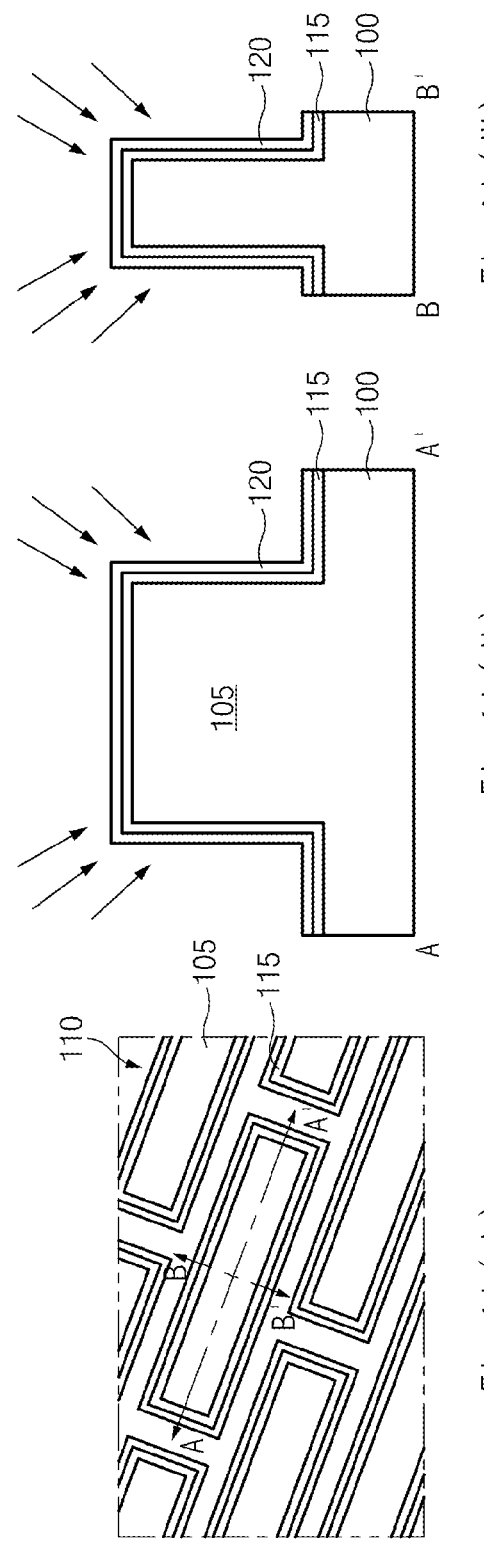

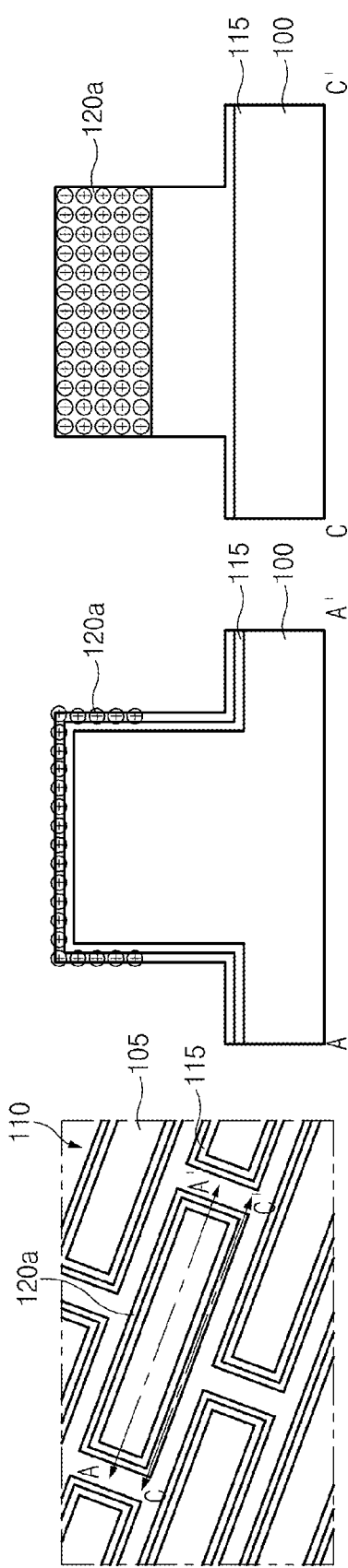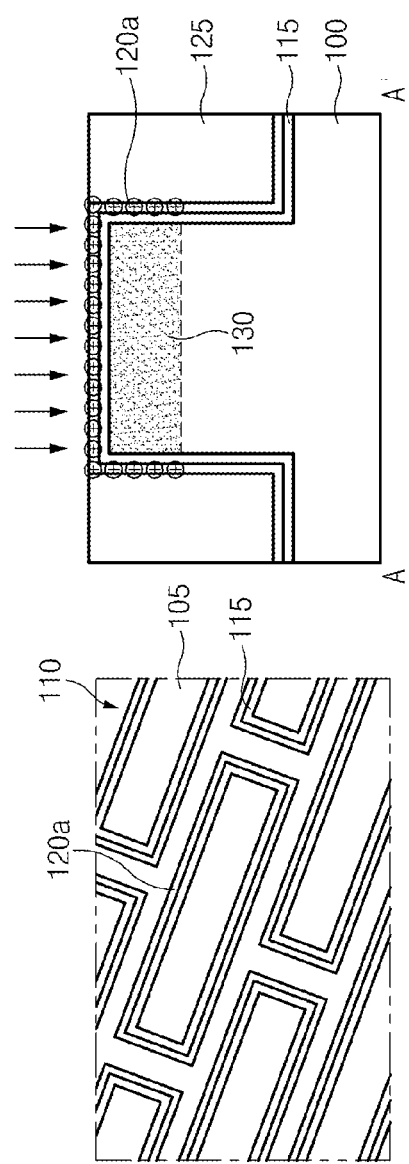

SEMICONDUCTOR DEVICE AND METHOD FOR FORMING THE SAME

CROSS-REFERENCE TO RELATED APPLICATION

The present application claims priority to Korean Patent Application No. 10-2014-0035447, filed on 26 Mar. 2014, the disclosure of which is hereby incorporated herein in its entirety by reference.

BACKGROUND

Embodiments of the present disclosure relate to a semiconductor device and a method for forming the same, and more particularly, to a semiconductor device having an N-rich liner nitride film, and a method for forming the same.

As the degree of integration of a semiconductor device increases, a channel length of a transistor gradually decreases. However, the reduction of the channel length of the transistor may cause a Drain Induced Barrier Lowering (DIBL) phenomenon, a hot carrier effect, and a short channel effect such as punch-through. In order to address such issues, a variety of methods have been introduced by many developers and companies. Such methods include a method for reducing the depth of a junction region, a method for increasing a channel length by forming a recess in a channel region of a transistor, and the like.

However, as the degree of integration of a semiconductor memory device has come close to Gigabits, even smaller-sized transistors are being manufactured. However, in a semiconductor device that uses a planar transistor in which a gate electrode is formed over a semiconductor substrate and a junction region is formed at both sides of the gate electrode, although the channel length is scaled down, it is difficult to fabricate a device having a small enough unit cell size. In order to solve the above-mentioned problems, a gate structure has developed from a recess gate structure to a buried gate structure.

When a gate adjacent to a main gate of a buried gate structure repeatedly operates, a row hammer phenomenon occurs. As a result, data stored in a storage node contact plug of the main gate is distorted.

BRIEF SUMMARY

Various embodiments of the present disclosure are directed to providing a semiconductor device and a method for forming the same, which substantially obviate one or more problems due to limitations and disadvantages of the related art.

Embodiments of the present disclosure relate to a semiconductor device and a method for forming the same in which an N-rich liner nitride film is disposed only over an upper sidewall of an active region. Embodiments of the present disclosure are directed to reducing Gate Induced Drain Leakage (GIDL) and reducing the effects of a row hammer phenomenon.

In accordance with an aspect of the present disclosure, a semiconductor device comprising an active region; a device isolation film defining the active region; a first liner nitride film disposed over a lower portion of a sidewall of the active region; and a second liner nitride film disposed over an upper portion of the sidewall of the active region, the second liner nitride film having a higher density of nitrogen than a density of nitrogen in the first liner nitride film.

The second liner nitride film is an N-rich liner nitride film including positive charges.

Further comprising a sidewall oxide film disposed over the sidewall of the active region.

The first liner nitride film and the second liner nitride film are connected over the sidewall of the active region.

Further comprising a plurality of buried gates disposed in the active region and the device isolation film.

Further comprising source/drain junction regions disposed in edge portions of the active region and disposed between buried gates disposed in the active region.

Each of the source/drain junction regions disposed in the edge portions of the active region vertically overlaps with the second liner nitride film.

Further comprising a bit line contact plug coupled to the source/drain junction region disposed between the buried gates disposed in the active region; and storage node contact plugs coupled to the source/drain junction regions disposed in the edge portions of the active region, respectively.

In accordance with another aspect of the present disclosure, the method comprising forming a device isolation trench defining an active region in a semiconductor substrate; and forming a liner nitride film including a first liner nitride film disposed over a lower portion of a sidewall of the active region and a second liner nitride film disposed over a upper portion of the sidewall of the active region, the second liner nitride film including a higher density of nitrogen than a density of nitrogen in the first liner nitride film.

The second liner nitride film is an N-rich liner nitride film including positive charges.

Forming the liner nitride film includes: forming a liner nitride layer along an entire surface of the semiconductor substrate including the active region and the device isolation trench; and performing an ion implantation process on a portion of the liner nitride layer that is disposed over the upper portion of the sidewall of the active region to form the second liner nitride film, wherein the first liner nitride film is disposed below the second liner nitride film and over the lower portion of the sidewall of the active region.

The ion implantation process is a tilted ion implantation process.

The tilted ion implantation process is performed on a portion of the liner nitride layer that is disposed over an upper portion of the active region.

The tilted ion implantation process is performed with nitrogen ions having a density of about $1E15$ $cm^{-2}$, and wherein the nitrogen ions are implanted at an angle of about $7\sim35°$ with respect to a surface of the semiconductor substrate.

Forming the liner nitride includes: forming a liner nitride layer along an entire surface of the semiconductor substrate including the active region and the device isolation trench; performing an etch-back process on the liner nitride layer so that the liner nitride layer remains only over the lower portion of the sidewall of the active region to form the first liner nitride film; and forming the second liner nitride film over the upper portion of the sidewall of the active region.

The liner nitride layer is a first liner nitride layer, and wherein forming the second liner nitride film includes: forming a second liner nitride layer, which includes a higher density of nitrogen than a density of nitrogen in the first liner nitride layer, along an entire surface of the semiconductor substrate including the first liner nitride film; and performing an etch-back process on the second liner nitride layer so that the second liner nitride layer remains only over the upper portion of the sidewall of the active region to form the second liner nitride film.

Further comprising: forming a device isolation film by filling the device isolation trench in which the first and second liner nitride films are formed; forming recesses in the active region and the device isolation film; forming gate electrodes by filling the recesses with a conductive material; forming a capping film over the conductive material to form a buried gate in each of the recesses; and forming an interlayer insulation film over an entire surface of the semiconductor substrate including the gate electrodes.

Further comprising: forming source/drain junction regions in an upper portion of the active region.

Further comprising: forming contact holes exposing the source/drain junction regions by etching the interlayer insulation film; and forming contact plugs by filling the contact holes with a conductive material.

It is to be understood that both the foregoing general description and the following detailed description of embodiments are not limiting, but are intended to provide further explanation of the invention as claimed.

DESCRIPTION OF EMBODIMENTS

Reference will now be made to embodiments of the present disclosure, examples of which are illustrated in the accompanying drawings. Wherever possible, the same reference numbers are used throughout the drawings to refer to the same or like portions. A semiconductor device and a method for forming the same according to embodiments will hereinafter be described with reference to the accompanying drawings.

Figure 1A:
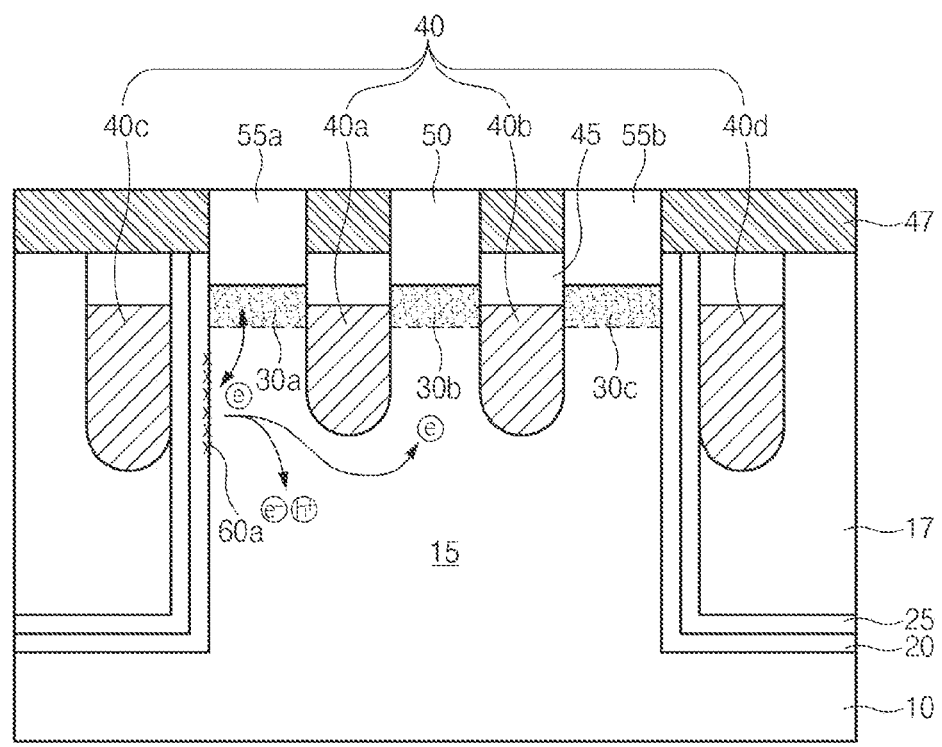
FIGS. 1a and 1b are cross-sectional views illustrating a passing gate (PG) row hammer phenomenon according to the prior art.
Figure 1B:
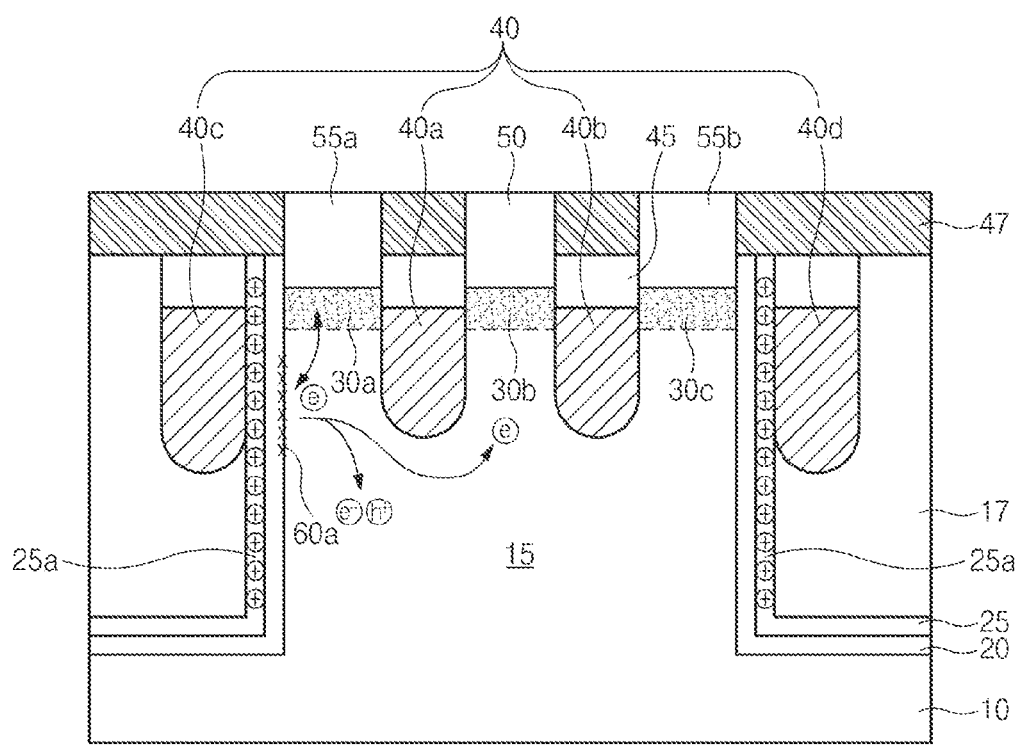

FIGS. 1a and 1b are cross-sectional views illustrating a passing gate (PG) row hammer phenomenon.

Referring to FIG. 1a, an active region 15 and a device isolation film 17 defining the active region 15 are formed in a semiconductor substrate 10. A sidewall oxide film (also called a wall oxide film) 20 and a liner nitride film 25 are formed between the active region 15 and the device isolation film 17. FIG. 1a illustrates four buried gates 40 formed in the active region 15 and the device isolation film 17. In FIG. 1a, one of the two buried gates 40 disposed in the active region 15 is referred to as a main gate 40a, and the other one is referred to as a neighbor gate 40b. One of the two buried gates 40 disposed in the device isolation film 17, which is closest to the main gate 40a, is referred to as a passing gate 40c. The other one of the two buried gates 40 disposed in the device isolation film 17, which is closest to the neighbor gate 40b, is a gate 40d.

Source/drain junction regions 30a, 30b, and 30c are formed in a portion of the active region 15 between the buried gates 40a and 40c, in a portion of the active region 15 between the buried gates 40a and 40b, and in a portion of the active region 15 between the buried gates 40b and 40d, respectively. A capping film 45 is formed over each of the buried gates 40, so that each of the buried gates 40 can be isolated in a corresponding active region 15 or device isolation film 17. An interlayer insulation pattern 47 is formed over the capping film 45 and defines a region reserved for a storage node contact plug and a region reserved for a bit line contact plug.

A bit line contact plug 50 and storage node contact plugs 55a and 55b, each of which is coupled to a corresponding one of the source/drain junction regions 30a, 30b, and 30c formed in the active region 15, are formed in the regions reserved for the bit line contact plug and the storage node contact plug over the semiconductor substrate 100 between the buried gates 40, e.g., 40a, 40b, 40c, and 40d. In FIG. 1a, the bit line contact plug 50 is disposed over the source/drain junction region 30b formed in the portion of the active region 15 between the buried gates 40a and 40b. The first storage node contact plug 55a is disposed over the source/drain junction region 30a formed in a first edge portion of the active region 15 between the buried gates 40a and 40c. The second storage node contact plug 55b is disposed over the source/drain junction region 30c formed in a second edge portion of the active region 15 between the buried gates 40b and 40d.

In the semiconductor device shown in FIG. 1a, if the passing gate 40c is turned on, electrons stored in the storage node contact plug 55a located at one side of the main gate 40a move to the inside of the semiconductor substrate 10. Some electrons are trapped (or captured) and form a trap layer 60a at an interface between the active region 15, which is adjacent to the passing gate 40c, and the device isolation film 17.

Thereafter, if the passing gate 40c is turned off, electrons in an inversion layer move to the storage node contact plug 55a. However, the electrons captured in the trap layer 60a do not exit due to a time delay. The electrons in the trap layer 60a may be recombined with holes or re-emitted, and most of the re-emitted electrons move to the storage node contact plug 55a. However, some of the re-emitted electrons may be recombined with holes and move to the bit line contact plug 50, which is disposed at the other side of the main gate 40a, via a region under the main gate 40a. Therefore, an electric potential of the storage node contact plug 55a increases by a value corresponding to the amount of electrons that do not return to the storage node contact plug 55a, i.e., the amount of leaked electrons. As a result, if the passing gate 40c is repeatedly turned on/off, and thus the electric potential of the storage node contact plug 55a gradually increases, data '0' stored in the storage node contact plug 55a of the main gate 40a may be distorted to data '1'. Herein, the data '0' corresponds to a low potential, and the data '1' corresponds to a high potential. This phenomenon is referred to as a Passing Gate (PG) row hammer phenomenon.

Referring to FIG. 1b, a sidewall oxide film 20 is formed between an active region 15 and a device isolation film 17. An N-rich liner nitride film 25a is disposed between the sidewall oxide film 20 and the device isolation film 17. The N-rich liner nitride film 25a is formed over a sidewall of the sidewall oxide film 20 that corresponds to the entire sidewall of the active region 15.

In this case, if a passing gate 40c is turned on as described with reference to FIG. 1a, electrons stored in a storage node contact plug 55a disposed at one side of a main gate 40a move to the inside of a semiconductor substrate 10. The electrons are captured and form a trap layer 60a at an interface between the active region 15, which is adjacent to the passing gate 40c, and the device isolation film 17. After that, if the passing gate 40c is turned off, electrons captured in the trap layer 60a are emitted, and may be recombined with holes or easily move to a bit line contact plug 50, which is disposed at the other side of the main gate 40a, via a region under the main gate 40a, with the help of an electric field created by positive charges of the N-rich liner nitride film 25a. As a result, the PG row hammer phenomenon occurs.

Figure 2A:
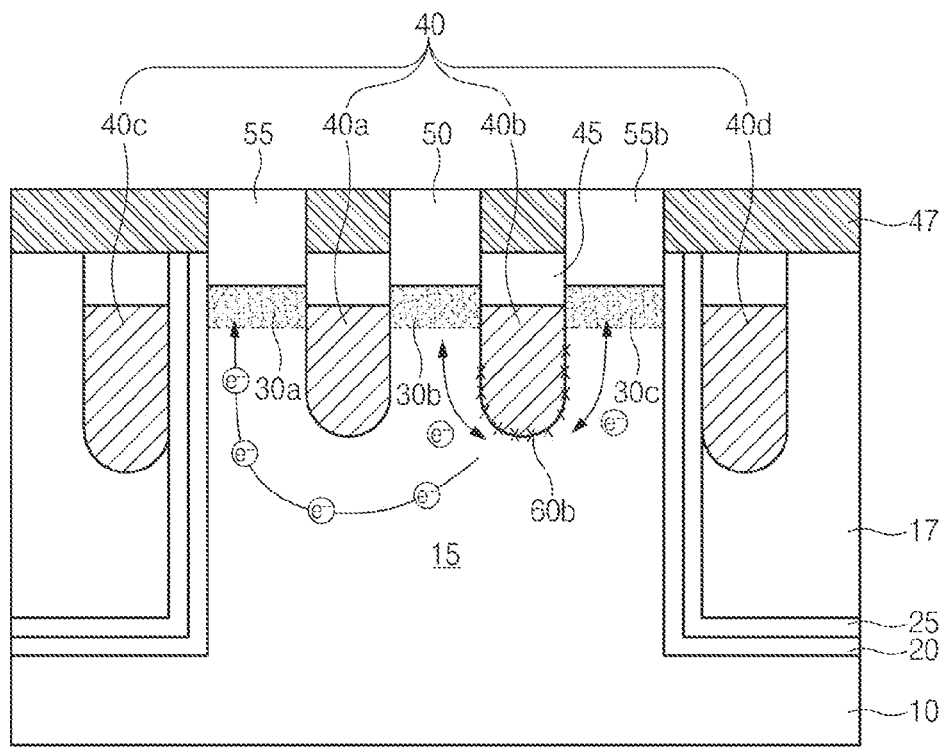
FIGS. 2a and 2b are cross-sectional views illustrating a neighbor gate (NG) row hammer phenomenon according to the prior art.
Figure 2B:
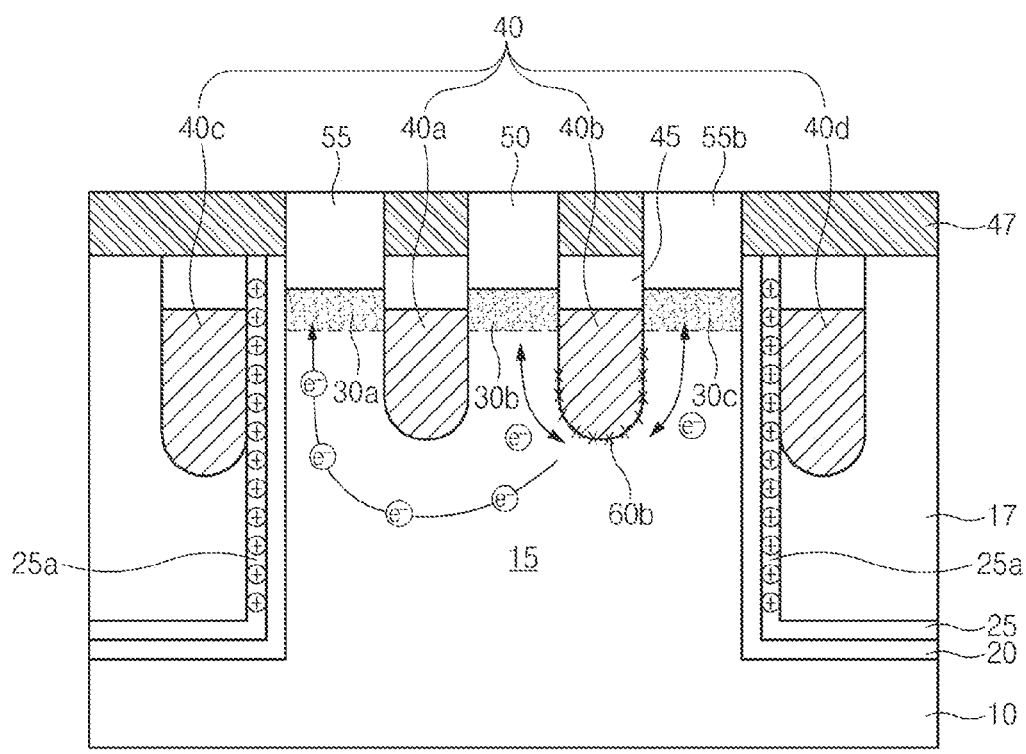

FIGS. 2a and 2b are cross-sectional views illustrating a neighbor gate (NG) row hammer phenomenon. Semiconductor devices shown in FIGS. 2a and 2b are identical in structure to the semiconductor devices shown in FIGS. 1a and 1b, respectively.

Referring to FIG. 2a, if a neighbor gate (NG) 40b is turned on, electrons stored in a bit line contact plug 50 and electrons stored in a storage node contact plug 55b adjacent to the neighbor gate 40b move to the inside of a semiconductor substrate 10. In this case, a trap layer 60b is formed at an interface between the bottom part of the neighbor gate 40b and the active region 15, where some electrons are captured.

After that, if the neighbor gate 40b is turned off, electrons move to the bit line contact plug 50 and the storage node contact plug 55b in which the electrons were originally stored. However, electrons in the trap layer 60b do not exit due to a time delay. The electrons in the trap layer 60b may be recombined with holes or re-emitted. Most of the re-emitted electrons may move to the bit line contact plug 50 and the storage node contact plug 55b. However, some of the re-emitted electrons may be recombined with holes and move to the storage node contact plug 55a adjacent to a main gate 40a via a region under the main gate 40a. As a result, an electric potential of the storage node contact plug 55a decreases by a value corresponding to the amount of electrons that do not return to the storage node contact plug 55b, i.e., the amount of leaked electrons, but instead move to the storage node contact plug 55a. If the neighbor gate 40b is repeatedly turned on/off, and thus the electric potential of the storage node contact plug 55a gradually decreases, data '1' stored in the storage node contact plug 55a adjacent to the main gate 40a may be distorted to data '0'. This phenomenon is referred to as a Neighbor Gate (NG) row hammer phenomenon.

Referring to FIG. 2b, a sidewall oxide film 20 is formed between an active region 15 and a device isolation film 17. An N-rich liner nitride film 25a is formed between the sidewall oxide film 20 and the device isolation film 17. The N-rich liner nitride film 25a is formed over a sidewall of the sidewall oxide film 20 that corresponds to the entire sidewall of the active region 15.

If a neighbor gate 40b is turned on as described with reference to FIG. 2a, electrons stored in both a bit line contact plug 50 and a storage node contact plug 55b adjacent to the neighbor gate 40b move to the inside of the semiconductor substrate 10. In this case, a trap layer 60b is formed at an interface between the bottom part of the neighbor gate 40b and the active region 15, where electrons are captured. After that, if the neighbor gate 40b is turned off, the electrons in the trap layer 60b are emitted, and may be recombined with holes and easily move to a storage node contact plug 55a adjacent to a main gate 40a via a region under the main gate 40a, with the help of an electric field created by positive charges of the N-rich liner nitride film 25a. Accordingly, a neighbor gate (NG) row hammer phenomenon occurs.

Figure 3A:
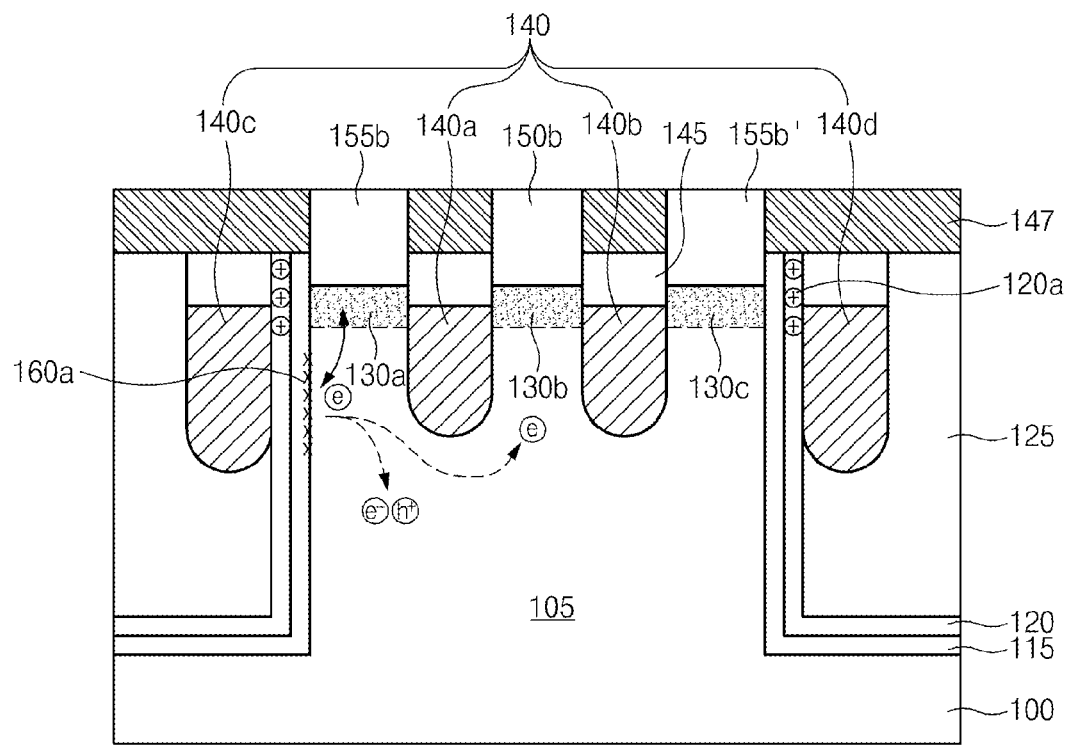
FIGS. 3a and 3b are cross-sectional views illustrating a semiconductor device according to an embodiment.
Figure 3B:
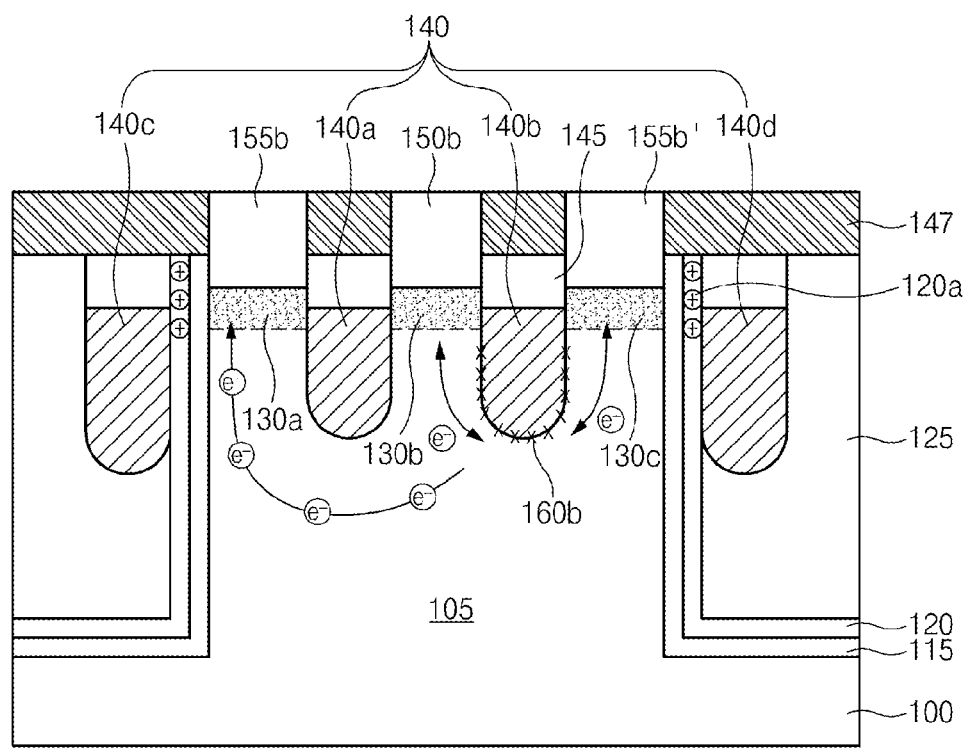

FIGS. 3a and 3b are cross-sectional views illustrating a semiconductor device according to an embodiment.

Referring to FIGS. 3a and 3b, a device isolation film 125 defining an active region 105 is formed in a semiconductor substrate 100. In an embodiment, a sidewall oxide film 115 is formed along a profile of the active region, and is disposed between the active region 105 and the device isolation film 125. A liner nitride film 120 and an N-rich liner nitride film 120a are formed over the sidewall oxide film 115, between the sidewall oxide film 115 and the device isolation film 125.

The N-rich liner nitride film 120a is disposed over an upper portion of a sidewall of the active region 105, and the liner nitride film 120 is formed over the bottom of the sidewall oxide film 115 and over a lower portion of the sidewall of the active region 105. In an embodiment, the N-rich liner nitride film 120a is disposed at an upper portion of the liner nitride film 120 and is continuous with the liner nitride film 120. In an embodiment, the N-rich liner nitride film 120a is in contact with the top surface of the liner nitride film 120. The liner nitride film 120 has a lower density of nitrogen than a density of nitrogen in the N-rich liner nitride film 120a.

A plurality of buried gates 140, e.g., 140a, 140b, 140c, and 140d, may be formed in the active region 105 and the device isolation film 125. In an embodiment, as shown in FIGS. 3a and 3b, two buried gates 140, for example, a main gate 140a and a neighbor gate 140b, are disposed in the active region 105, and two passing gates 140c and 140d are disposed in the device isolation film 125 at opposite sides of the active region 105.

Source/drain junction regions 130a, 130b, and 130c are formed in the active region 105 between respective buried gates 140a to 140d. With respect to the orientation of FIGS. 3a and 3b, the source/drain junction region disposed in an edge portion of the active region 105 may vertically overlap with the N-rich liner nitride film 120a, and may be formed to a greater depth than the N-rich liner nitride film 120a. In an embodiment, a top surface of the source/drain junction region 130 is disposed lower than an uppermost portion of the N-rich liner nitride film 120a.

A bit line contact plug 150b is disposed over the source/drain junction region 130b, which is disposed between the main gate 140a and the neighbor gate 140b. Storage node contact plugs 155b and 155b' are disposed over the source/drain junction regions 130a and 130c that are disposed in both edge portions of the active region 105, respectively. The edge portions of the active region 105 are adjacent to the device isolation film 125. That is, in FIGS. 3a and 3b, one storage node contact plug 155b is disposed between the main gate 140a in the active region 105 and the passing gate 140c in the device isolation film 125, and the other storage node contact plug 155b' is disposed between the neighbor gate 140b in the active region 105 and the buried gate 140d in the device isolation film 125.

A PG row hammer phenomenon and a NG row hammer phenomenon in a semiconductor device in accordance with an embodiment of the present disclosure will be described with reference to FIG. 3a and FIG. 3b.

Referring to FIG. 3a, if the passing gate 140c is turned on, electrons stored in the storage node contact plug 155b adjacent to the main gate 140a move so that the electrons are captured and form a trap layer 160a at an interface between the active region 105 adjacent to the passing gate 140c and the device isolation film 125.

After that, if the passing gate 140c is turned off, positive charges of the N-rich liner nitride film 120a attract electrons emitted from the trap layer 160a. Since the N-rich liner nitride film 120a is disposed at an upper portion of the liner nitride film 120, the emitted electrons are able to return to the storage node contact plug 155b. As a result, the PG row hammer phenomenon can be suppressed.

If the neighbor gate 140b is turned on, as shown in FIG. 3b, electrons stored in the storage node contact plug 155b' adjacent to the neighbor gate 140b moves so that the electrons are captured and form the trap layer 160b at an interface between the neighbor gate 140b and the active region 105. After that, if the neighbor gate 140b is turned off, positive charges of the N-rich liner nitride film 120a attract electrons emitted from the trap layer 160b and allow the emitted electrons to return to the storage node contact plug 155b'. As a result, the NG row hammer phenomenon can be suppressed.

FIGS. 4a(i-ii) to 4j are plan views and cross-sectional views illustrating a method for forming a semiconductor device according to an embodiment. In more detail, FIGS. 4a(i) to 4f(i) are plan views illustrating the semiconductor device, and FIGS. 4a(ii) to 4f(ii) are cross-sectional views illustrating the semiconductor device taken along a line A-A' of FIGS. 4a(i) to 4f(i). FIG. 4d(iii) is a cross-sectional view illustrating the semiconductor device taken along a line B-B' of FIG. 4d(i), and FIG. 4e(iii) is a cross-sectional view illustrating the semiconductor device taken along a line C-C' of FIG. 4e(i).

Referring to FIGS. 4a(i) and 4a(ii), a mask pattern (not shown) defining the active region 105 is formed over the semiconductor substrate 100. The semiconductor substrate 100 may include a monocrystalline silicon material. The semiconductor substrate 100 may be a silicon substrate, a Silicon On Insulator (SOI) substrate, or the like. The mask pattern may be a bar pattern that is obliquely tilted at a predetermined angle in a plan view. Adjacent mask patterns may be spaced apart from each other by a distance in the short-axis and the long-axis directions.

The semiconductor substrate 100 is etched using the mask patterns as an etch mask, so that a device isolation trench 110 for defining the active region 105 is formed. Subsequently, the mask patterns are removed.

Referring to FIGS. 4b(i) and 4b(ii), a sidewall oxide film 115 is formed along the entire surface of the semiconductor substrate 100 including the active region 105 and the device isolation trench 110. The sidewall oxide film 115 may be formed by oxidizing the semiconductor substrate 100, or may be formed by depositing an oxide film over the semiconductor substrate 100.

Referring to FIGS. 4c(i), 4c(ii), and 4c(iii), a liner nitride film 120 is formed over the sidewall oxide film 115. The liner nitride film 120 may mitigate stress of the semiconductor device and prevent diffusion of doping elements such as boron (B), resulting in the improvement of refresh characteristics of the semiconductor device.

Referring to FIGS. 4d(i) to 4e(iii), a tilted ion implantation process is performed on the active region 105 over which the liner nitride film 120 is formed. The tilted ion implantation may be performed with nitrogen ions having a density of $1E15\ cm^{-2}$. In a tilted ion implantation process in accordance with an embodiment, the nitrogen ions may be implanted at an angle of 7~35° with respect to a top surface of the semiconductor substrate 100.

In an embodiment, the ion implantation is performed four times. A first ion implantation process is performed in a first direction along the long axis of the active region 105 (e.g., in a first direction along the A-A' line of FIG. 4d(i)). A second ion implantation process is performed in a second direction along the long axis of the active region 10, that is, the other direction of the long axis opposite to the first direction (e.g., a second direction along the A-A' line of FIG. 4d(i) that opposes the first direction along the line A-A').

Thereafter, a third ion implantation process is performed in a third direction along the short axis of the active region 105 (e.g., a first direction along the B-B' line of FIG. 4d(i)). A fourth ion implantation process is then performed in a fourth direction along the short axis of the active region 105, that is, the other direction of the short axis opposite to the third direction (e.g., a second direction along the line B-B' line of FIG. 4d(i) that opposes the first direction along the line B-B line).

In this way, if the tilted ion implantation process is performed on the active region 105 over which the liner nitride film 120 is formed, nitrogen ions are implanted into a portion of the liner nitride film 120 that is formed not only over a top surface of the active region 105 and also into a portion of the liner nitride film 120 that is formed over an upper portion of a sidewall of the active region 105. As a result, the N-rich liner nitride film 120a, having a high density of nitrogen, is formed over the top surface and the upper portion of the sidewall of the active region 105. That is, the N-rich liner nitride film 120a may be formed to enclose an upper portion of the active region 105.

Referring to FIGS. 4f(i) and 4f(ii), an insulation film is formed over the entire surface of the semiconductor substrate 100 to fill the remaining portion of the device isolation trench 110 over the sidewall oxide film 115 and the liner nitride film 120. The insulation film may include a High Density Plasma Oxide film or a Spin on Dielectric (SoD) film. Thereafter, a Chemical Mechanical Polishing (CMP) process is performed on the insulation film until the N-rich liner nitride film 120a is exposed. As a result, the device isolation film 125 filling the device isolation trench 110 is formed.

Subsequently, ion implantation is performed over the entire surface of the semiconductor substrate 100 on which the device isolation film 125 is formed, so that a source/drain junction region 130 is formed in the active region 105. The source/drain junction region 130 may be formed within a predetermined range of the active region 105 so that the source/drain junction region 130 vertically overlaps with the N-rich liner nitride film 120a, with respect to the orientation of the figure. The source/drain junction region 130 may be formed to have a predetermined depth. In an embodiment, the source/drain junction region 130 may be formed to be deeper than the N-rich liner nitride film 120a.

Figure 4G:
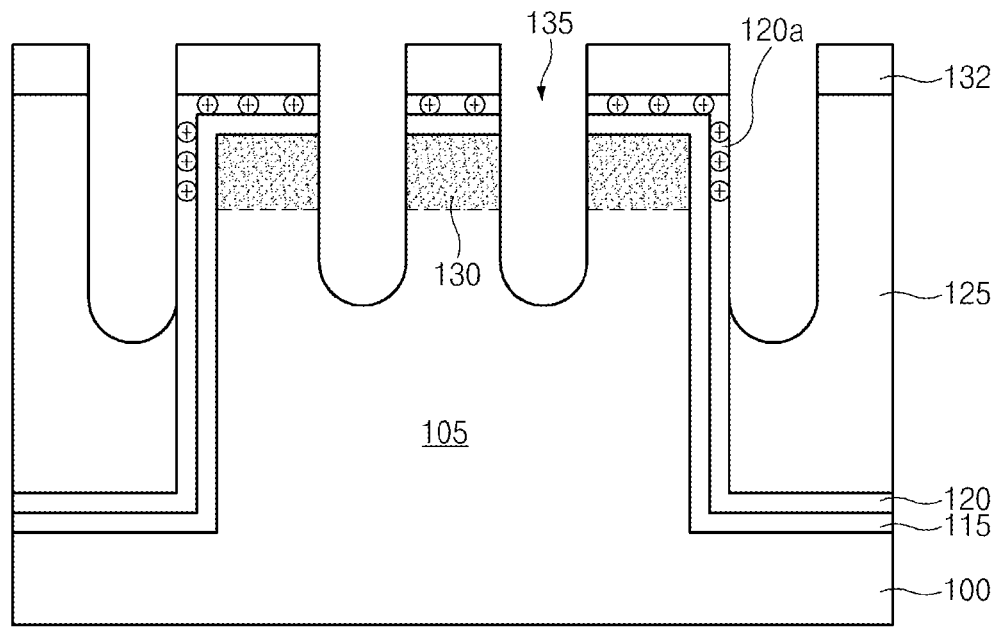
FIGS. 4a(i-ii) to 4j are plan views and cross-sectional views illustrating a method for forming the semiconductor device according to an embodiment.
Figure 4H:
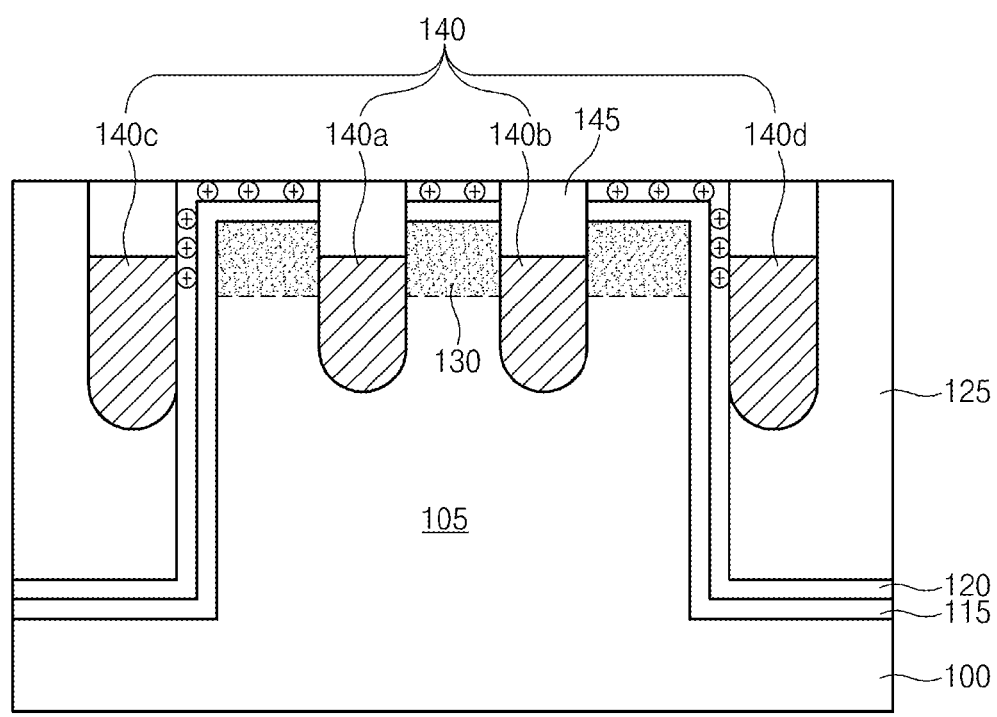
Figure 4I:
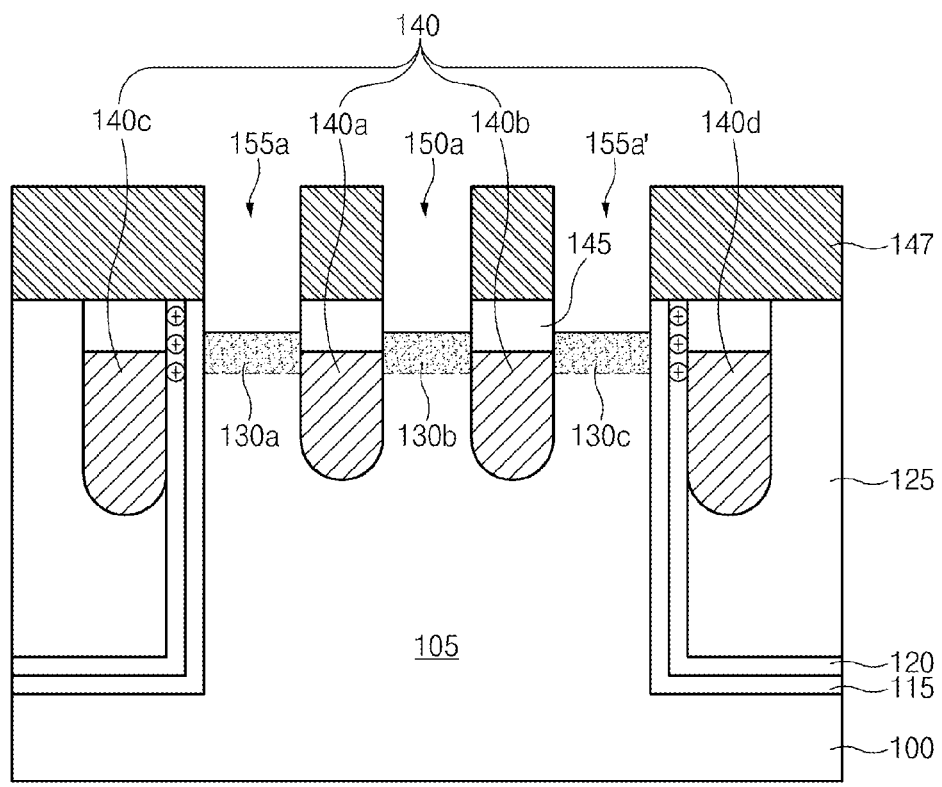

FIGS. 4g to 4i are cross-sectional views of a semiconductor device taken along a line A-A', which extends along a long axis of an active region 105, including the source/drain junction region 130. Referring to FIG. 4g, a mask pattern 132 defining a plurality of buried gate regions is formed over the semiconductor substrate 100 including the source/drain junction region 130. The mask pattern 132 may be formed of a Tetra Ethyle Ortho Silicate (TEOS) oxide film, a carbon layer, a silicon oxynitride (SiON) film, or a combination thereof. The active region 105 and the device isolation film 125 are etched using the mask pattern 132 as an etch mask to form recesses 135. Two recesses 135 may be formed in the active region 105, and one recess 135 may be formed in each of two portions of the device isolation film 125, which are disposed on opposite sides of the active region 105. In an embodiment, since the active region 105 having silicon and the device isolation film 125 having an oxide film have different etch selectivity, a recess 135 formed in the active region 105 and a recess 135 formed in the device isolation film 125 may have different depths. In an embodiment, the recess 135 formed in the device isolation film 125 has a greater depth than the recess 135 formed in the active region 105. The mask pattern 132 is then removed.

Referring to FIG. 4h, a gate oxide film (not shown) is formed along a profile of the recesses 135.

After that, a conductive material fills lower portions of the recesses 135, so that a plurality of gate electrodes 140 is formed. The gate electrode 140 may include one or more conductive materials such as titanium nitride (TiN), tantalum nitride (TaN), tungsten (W), and so on. In an embodiment, a TiN film or a TaN film is deposited with a small thickness so as to reduce resistance, and then a tungsten (W) film is deposited to fill the gap remaining in the trench to form the gate electrode 140. In another embodiment, the gate electrode 140 is formed of a stacked structure of the TiN film and the TaN film or a stacked structure of the TiN film, the TaN film, and the tungsten (W) film.

A capping film 145 is deposited to fill upper portions of the recesses 135, such that each of the gate electrodes 140 is isolated. The capping film 145 may be a nitride film or an oxide film. The gate electrodes 140 may include a main gate 140a, a neighbor gate 140b, a passing gate 140c, and a buried gate 140d. The main gate 140a and the neighbor gate 140b are disposed in the active region 105. The passing gate 140c and the buried gate 140d are disposed in the device isolation film 125.

Referring to FIG. 4i, an interlayer insulation film is formed over a resultant structure including the capping film 145. Thereafter, a mask pattern (not shown) is formed over the interlayer insulation film. The mask pattern defines a region reserved for a storage node contact plug and a region reserved for a bit line contact plug. Subsequently, some parts of the interlayer insulation film are etched using the mask pattern as an etch mask. As a result, an interlayer insulation pattern 147 defining the regions reserved for the storage node contact plug and the bit line contact plug. After that, a bit line contact hole 150a and storage node contact holes 155a and 155a' are formed by etching portions of the N-rich liner nitride film 120a, which are disposed over each source/drain junction regions 130 separated by the buried gates 140a and 140b until the source drain junction regions 130 are exposed. In an embodiment, upper portions of the separated source/drain junction regions 130 are also etched. In an embodiment, the remaining portions 130a, 130b, and 130c of the separated source/drain junction regions 130 have top surfaces that are higher than respective top surfaces of the buried gates 140a, 140b, 140c, and 140d.

Figure 4J:
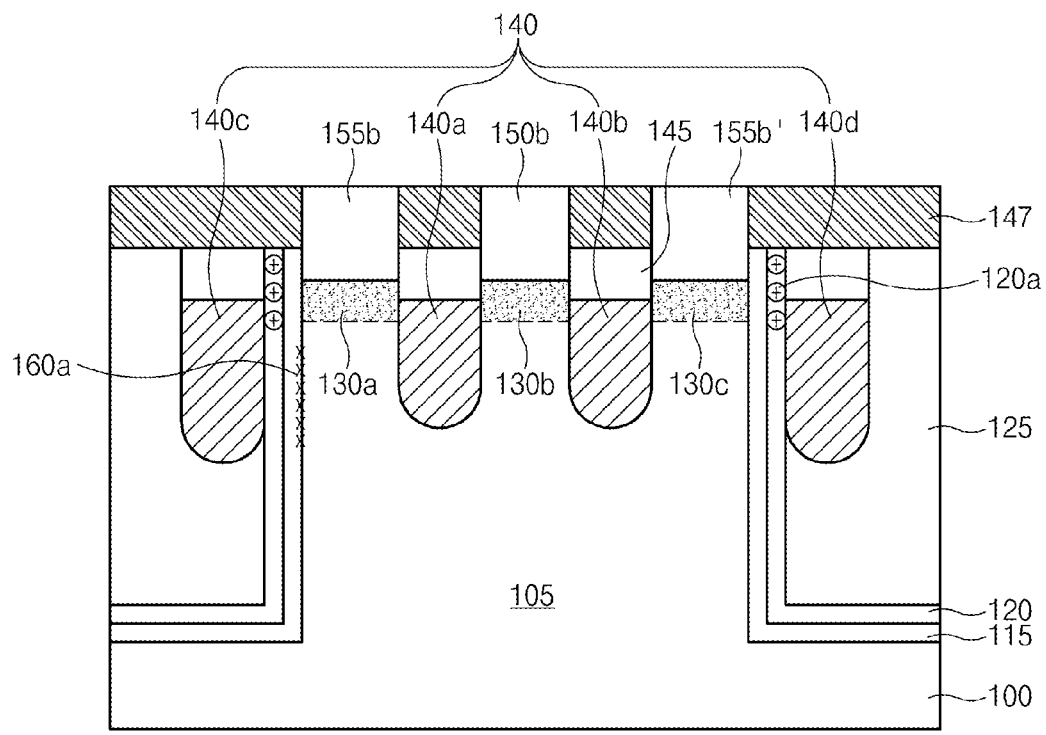

Referring to FIG. 4j, a conductive material is formed to fill the bit line contact hole 150a and the storage node contact holes 155a and 155a'. In an embodiment, the conductive material may be a metal film or a polysilicon film. In an embodiment, the polysilicon film is formed by growing an epitaxial silicon film through selective epitaxial growth (SEG). Subsequently, a planarization process (such as CMP) is performed on the conductive material and the interlayer insulation pattern 147, such that a bit line contact plug 150b and storage node contact plugs 155b and 155b' are formed. During the planarization process, an upper portion of the interlayer insulation pattern 147 may be removed.

FIGS. 5a to 5d are cross-sectional views illustrating a semiconductor device and a method for forming the same according to another embodiment.

Figure 5A:
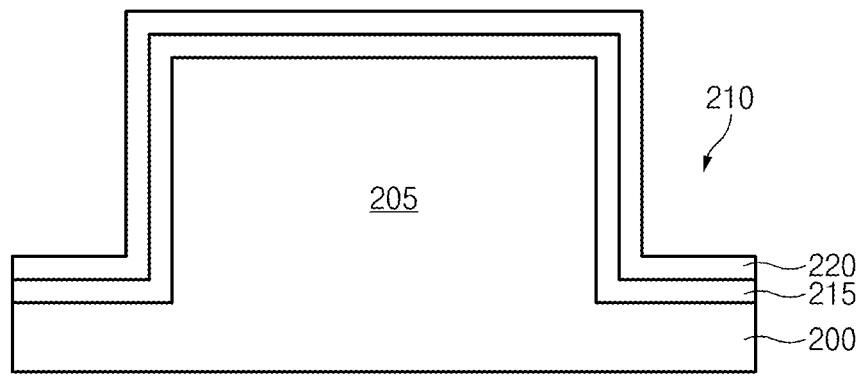
FIGS. 5a to 5d are cross-sectional views illustrating a semiconductor device according to another embodiment.

Referring to FIG. 5a, a device isolation trench 210 defining an active region 205 is formed in a semiconductor substrate 200. Thereafter, a sidewall oxide film 215 is formed along the entire surface of the semiconductor substrate 200 including the active region 205 and the device isolation trench 210. A liner nitride film 220 is formed over the sidewall oxide film 215.

Figure 5B:
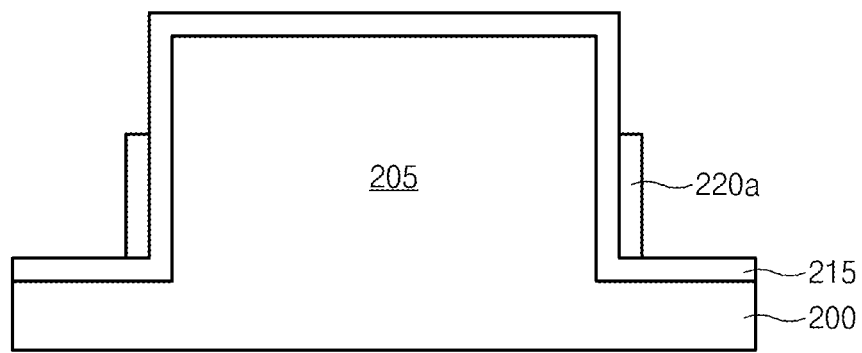

Referring to FIG. 5b, the liner nitride film 220 is etched back so that the liner nitride film 220a remains only over a lower portion of a sidewall of the active region 205.

Figure 5C:
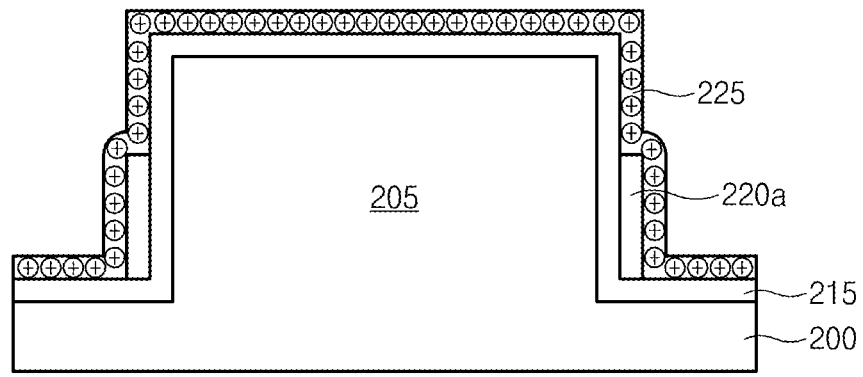

Referring to FIG. 5c, an N-rich liner nitride film 225 is formed over the entire surface of the semiconductor substrate 200 including the sidewall oxide film 215 and the remaining liner nitride film 220a.

Figure 5D:
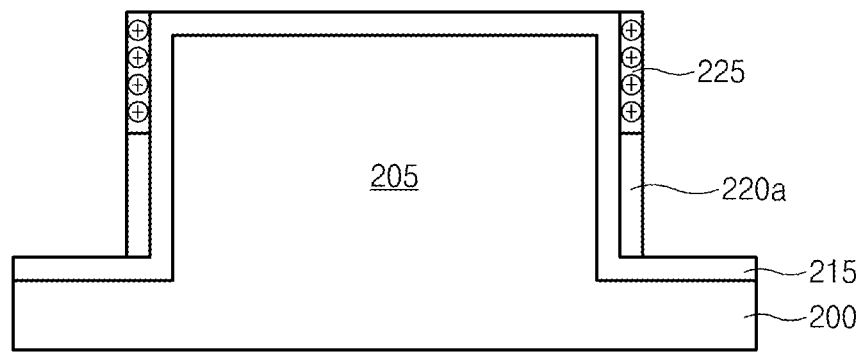

Referring to FIG. 5d, the N-rich liner nitride film 225 is etched back such that the N-rich liner nitride film 225 remains only over an upper portion of the sidewall of the active region 205. The N-rich liner nitride film 225 may be in contact with the remaining liner nitride film 220a. In another embodiment, the N-rich liner nitride film 225 may remain on the entire surface of the semiconductor substrate 200 including the remaining liner nitride film 220a of FIG. 5c without being etched back.

After that, buried gates, a bit line contact plug, and storage node contact plugs, etc. may be formed through substantially the same processes as described with reference to FIGS. 4f(i-ii) to 4j.

As described above, according to embodiments, a semiconductor device includes an N-rich liner nitride film only over an upper portion of a sidewall of an active region. Positive charges (or positive fixed charges) in the N-rich liner nitride film attract electrons to suppress a row hammer phenomenon. In addition, the N-rich liner nitride film can mitigate the generation of an electric field in a specific region in which a source/drain junction region overlaps with a gate, resulting in reduction of GIDL.

Those skilled in the art will appreciate that embodiments of the present disclosure may be carried out in specific ways other than those set forth herein without departing from the spirit and essential characteristics of the present disclosure. The above embodiments are therefore to be construed in all aspects as illustrative and not restrictive.

The above embodiments are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a volatile memory device or a non-volatile memory device. Other additions, subtractions, or modifications are obvious in view of the present disclosure and are intended to fall within the scope of the appended claims.

What is claimed is:

1. A semiconductor device comprising:
   an active region;
   a device isolation film defining the active region;
   a first liner nitride film disposed over a lower part of a sidewall of the active region;
   a second liner nitride film disposed over only an upper part of the sidewall of the active region, the second liner nitride film having a higher density of nitrogen than a density of nitrogen in the first liner nitride film; and
   source/drain junction regions disposed in an upper portion of the active region, wherein the source/drain junction regions vertically overlap with the second liner nitride film.

2. The semiconductor device according to claim 1, wherein the second liner nitride film is an N-rich liner nitride film including positive charges.

3. The semiconductor device according to claim 1, further comprising:
   a sidewall oxide film disposed over the sidewall of the active region.

4. The semiconductor device according to claim 1, wherein the first liner nitride film and the second liner nitride film are connected over the sidewall of the active region.

5. The semiconductor device according to claim 1, further comprising:
   a plurality of buried gates disposed in the active region and the device isolation film.

6. The semiconductor device according to claim 5, further comprising:
   a source/drain junction region disposed in the upper portion of the active region and disposed between buried gates disposed in the active region.

7. The semiconductor device according to claim 6, further comprising:
- a bit line contact plug coupled to the source/drain junction region disposed between the buried gates disposed in the active region; and
- storage node contact plugs coupled to the source/drain junction regions overlapping with the second liner nitride film, respectively.

8. A method for forming a semiconductor device, the method comprising:
- forming a device isolation trench defining an active region in a semiconductor substrate;
- forming a liner nitride film including a first liner nitride film disposed over a lower part of a sidewall of the active region and a second liner nitride film disposed over only an upper part of the sidewall of the active region, the second liner nitride film including a higher density of nitrogen than a density of nitrogen in the first liner nitride film; and
- forming source/drain junction regions in an upper portion of the active region, wherein the source/drain junction regions vertically overlap with the second liner nitride film.

9. The method according to claim 8, wherein the second liner nitride film is an N-rich liner nitride film including positive charges.

10. The method according to claim 8, wherein forming the liner nitride film includes:
- forming a liner nitride layer along an entire surface of the semiconductor substrate including the active region and the device isolation trench; and
- performing an ion implantation process on a portion of the liner nitride layer that is disposed over the upper part of the sidewall of the active region to form the second liner nitride film,
- wherein the first liner nitride film is disposed below the second liner nitride film and over the lower part of the sidewall of the active region.

11. The method according to claim 10, wherein the ion implantation process is a tilted ion implantation process.

12. The method according to claim 11, wherein the tilted ion implantation process is performed on a portion of the liner nitride layer that is disposed over the upper portion of the active region.

13. The method according to claim 11, wherein the tilted ion implantation process is performed with nitrogen ions having a density of about $1E15$ $cm^{-2}$, and wherein the nitrogen ions are implanted at an angle of about 7~35° with respect to a surface of the semiconductor substrate.

14. The method according to claim 8, wherein forming the liner nitride includes:
- forming a liner nitride layer along an entire surface of the semiconductor substrate including the active region and the device isolation trench;
- performing an etch-back process on the liner nitride layer so that the liner nitride layer remains only over the lower part of the sidewall of the active region to form the first liner nitride film; and
- forming the second liner nitride film over the upper part of the sidewall of the active region.

15. The method according to claim 14, wherein the liner nitride layer is a first liner nitride layer, and
wherein forming the second liner nitride film includes:
- forming a second liner nitride layer, which includes a higher density of nitrogen than a density of nitrogen in the first liner nitride layer, along an entire surface of the semiconductor substrate including the first liner nitride film; and
- performing an etch-back process on the second liner nitride layer so that the second liner nitride layer remains only over the upper part of the sidewall of the active region to form the second liner nitride film.

16. The method according to claim 8, further comprising:
- forming a device isolation film by filling the device isolation trench in which the first and second liner nitride films are formed;
- forming recesses in the active region and the device isolation film;
- forming gate electrodes by filling the recesses with a conductive material;
- forming a capping film over the conductive material to form a buried gate in each of the recesses; and
- forming an interlayer insulation film over an entire surface of the semiconductor substrate including the gate electrodes.

17. The method according to claim 16, further comprising:
- forming contact holes exposing the source/drain junction regions by etching the interlayer insulation film; and
- forming contact plugs by filling the contact holes with a conductive material.

* * * * *